United States Patent [19]
Geis et al.

[11] Patent Number: 5,220,161
[45] Date of Patent: Jun. 15, 1993

[54] POSITION-SENSING AND MOTION VERIFICATION ASSEMBLY FOR A MOTOR-DRIVEN MECHANISM

[75] Inventors: Jerome P. Geis, Elkhart; Joseph E. Perry, Osceola, both of Ind.

[73] Assignee: Miles Inc., Elkhart, Ind.

[21] Appl. No.: 856,396

[22] Filed: Mar. 23, 1992

[51] Int. Cl.⁵ .............................................. G01D 5/34
[52] U.S. Cl. ............................ 250/231.13; 356/244
[58] Field of Search ................. 250/231.13, 231.14, 250/231.17, 231.18; 356/375, 246, 244, 427, 426

[56] References Cited

U.S. PATENT DOCUMENTS

| | | | |
|---|---|---|---|
| 4,123,173 | 10/1978 | Bullock et al. | 356/246 |
| 4,233,592 | 11/1980 | Leichle | 250/231.17 X |
| 4,695,164 | 9/1987 | Zivitz et al. | 356/427 |
| 4,827,123 | 5/1989 | Gray | 250/231.14 |
| 4,912,389 | 3/1990 | Eguchi | 250/231.14 X |
| 5,117,105 | 5/1992 | Nagase et al. | 250/231.18 |

*Primary Examiner*—David C. Nelms
*Assistant Examiner*—John R. Lee
*Attorney, Agent, or Firm*—Roger N. Coe

[57] ABSTRACT

A position sensing and motion verification assembly for a motor-driven mechanism includes a base member on which a sensor pattern is fabricated. The sensor pattern includes a predetermined orientation of tabs and notches of varying widths. A home position is defined in the sensor pattern and the polarity of the pattern is inverted on opposite sides of the home position. A single sensor such as an optical interrupter is mounted in the assembly in a position relative to the sensor pattern to sense the tabs and notches.

11 Claims, 1 Drawing Sheet

POSITION-SENSING AND MOTION VERIFICATION ASSEMBLY FOR A MOTOR-DRIVEN MECHANISM

BACKGROUND OF THE INVENTION

A. Field of the Invention

The present invention relates to a new and improved device for sensing the position and motion of a motor-driven assembly; and more specifically, to a new and improved device using a single sensor for sensing the position and motion of a motor-driven mechanism.

B. Description of the Background Art

Centrifugal assemblies for performing sequential analytical reactions include a cartridge holder for the positioning of an analytical reaction cassette or cartridge. A stepper motor is included in these assemblies and functions to rotate the cartridge holder and cartridge through sequential analytical assay procedures; for example, to determine the amount of an analyte in a liquid test mixture. This procedure requires the cartridge holder to be in the home position for placing a reaction cassette or cartridge into the holder prior to the assay procedures, and to be in the home position at the end of the assay procedures in order to remove the reaction cassette or cartridge.

Since the cartridge holder must be in the home position to commence the sequential analytical assay procedures, the actual position of the holder must be first determined. If the cartridge holder is not in the home position, it must be returned to that position before the sequential analytical assay procedures are begun. If the cartridge holder is moved to the home position, the movement must be verified in order to prevent damage to the motor if the cartridge holder were to bind and movement were prevented.

Consequently, two functions must be provided in the assembly or mechanism. The first function is determining the initial position of the cartridge holder. The second function is to verify movement of the mechanism.

Currently, assemblies are available that use two sensors to sense position and verify motion. One assembly of this type includes two concentric rings with a sensor adjacent each ring. The first ring and first sensor both function to determine the initial position of the assembly, and the second ring and second sensor both verify the motion of the assembly. Another example of an assembly of this type is one that has a configuration of uniform gear teeth. The position of the gear teeth is sensed by a first sensor. A hole is formed in the assembly inward of the teeth, and the passage of light through that hole is sensed by a second sensor to locate the home position.

Although there are assemblies that home elements such as printwheels, these assemblies typically do not have the capability of sensing positions away from the home position. Examples of these assemblies are provided in U.S. Pat. No. 4,541,746 and International Publication No. WO 90/00325 published on Jan. 11, 1990. These and other devices require two sensors, are expensive, cumbersome and bulky, and it is difficult to align both sensors. Consequently, it is desirable to provide an assembly that overcomes these deficiencies.

SUMMARY OF THE INVENTION

Briefly, the present invention is directed to a new and improved assembly for sensing positions and verifying motion of a motor-driven mechanism such as a cartridge holder for an analytical reaction cassette or cartridge. A sensor pattern defined by tabs and notches in a pre-selected configuration is formed on the cartridge holder. The assembly also includes a single sensor that senses the pattern of tabs and notches and determines the position of the cartridge holder relative to the home position. The sensor also verifies any movement of the cartridge holder. Since only a single sensor is required in this assembly, the cost is less than existing assemblies, and alignment of the sensor is not as difficult as existing assemblies requiring two sensors and is less likely to get out of adjustment during use.

BRIEF DESCRIPTION OF THE DRAWINGS

The above and other objects and advantages and novel features of the present invention will become apparent from the following detailed description of a preferred embodiment of the invention illustrated in the accompanying drawings wherein.

DESCRIPTION OF THE PREFERRED EMBODIMENT

Figure 1:
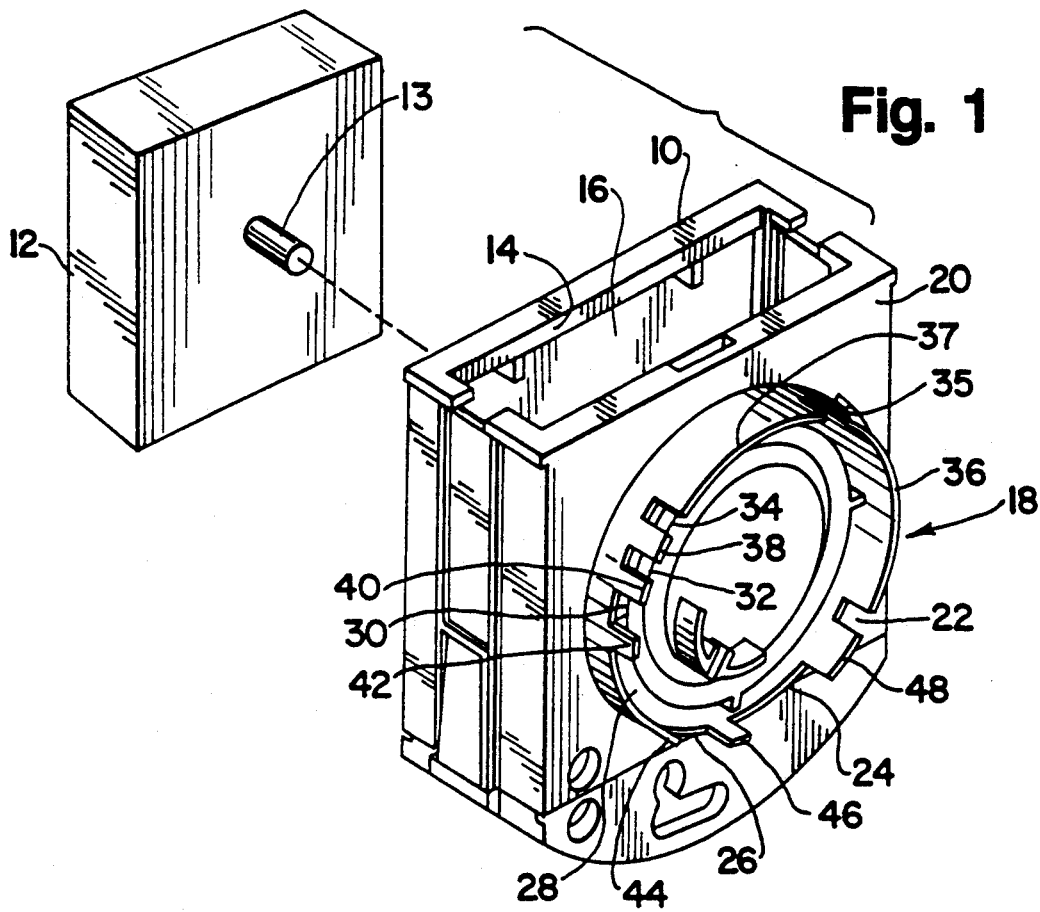
FIG. 1 is a perspective view of a cartridge holder for an analytical cartridge and a stepper motor that rotates the cartridge holder.

Referring initially to FIG. 1, there is illustrated a position sensing and motion verification assembly for an instrument or mechanism such as an analytical reaction cassette or cartridge holder 10. The cartridge holder 10 can be loaded with a reaction cassette or cartridge and then rotated by a stepper motor 12 to perform sequential analytical assay procedures typically used to determine the amount of an analyte in a liquid test mixture. In a preferred embodiment, the motor 12 is a two hundred step stepper motor and is coupled to the cartridge holder 10 by a motor shaft 13. The reaction cassette or cartridge can be in the form of a substantially square or rectangular container having a horizontal axis of rotation and including one or more analytical reagents that are contacted with a liquid test mixture in a desired ordered sequence to perform a particular assay procedure.

The cartridge holder 10 includes an opening 14 to an internal cavity 16. To commence an assay procedure, an analytical reaction cassette or cartridge (not shown) is placed into the internal cavity 16 through the opening 14. Once the cassette is positioned within the internal cavity 16, the stepper motor 12 is energized to rotate the cartridge holder 10 in a predetermined or desired ordered sequence. In order to indicate the position of the analytical reaction cartridge holder 10, such as the home position or initial reference position as well as positions away from the home position, a sensor pattern 18 is provided and is secured to a wall 20 of the cartridge holder 10. The sensor pattern 18 includes a pattern of notches or slits 22, 24, 26, 28, 30, 32, 34 and 35 and tabs or walls 36, 37, 38, 40, 42, 44, 46 and 48. The tabs 36-48 can include a reflective surface or can be light absorptive. Although the sensor pattern 18 is illustrated in the accompanying drawings and described above as a ring, it should be understood that other forms may be used. For example, the pattern 18 can be linear.

The assembly further includes a sensor or optical interrupter 52 (FIG. 2) that is used to sense rotary positions of the cartridge holder 10. The sensor 52 is mounted on a frame or housing 51 of the assembly. The sensor pattern 18 interacts with the sensor 52 to allow sensing of position and to verify movement of the cartridge holder 10. The sensor pattern 18 as defined by the slits or notches 22–35 and the tabs 36–48, which are located at critical rotary portions, interacts with the sensor 52 to provide positioning feedback through a microprocessor 54 (FIG. 3) which is connected to the sensor or optical interrupter 52 through wires or other connectors 53. This interaction allows the microprocessor 54 to confirm that the cartridge holder 10 has been properly rotated to critical sample and reagent pick up positions and that the proper mixing is occurring.

Figure 3:
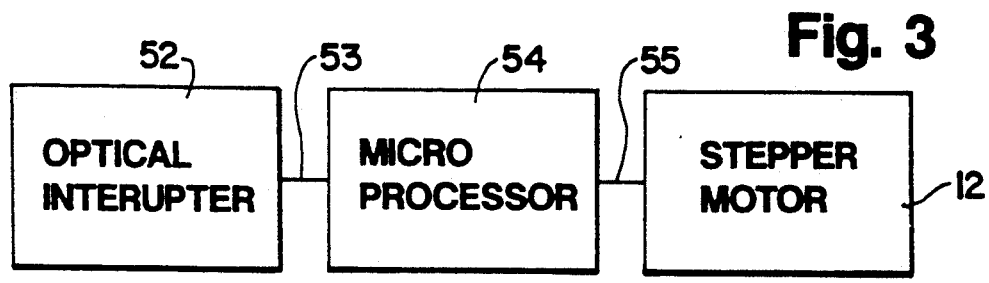
FIG. 3 is a block diagram of the connection of the sensor to the stepper motor through a microprocessor.

Referring to FIG. 3, a block diagram illustrating the interaction and connection of the optical interrupter 52, the microprocessor 54 and the stepper motor 12 is illustrated. Briefly, the optical interrupter 52 senses the position and motion of the sensor pattern 18. This information is communicated to the microprocessor 54 through wires 53 which in turn controls the rotation and direction of rotation of the stepper motor 12 through wires 55.

The pattern of the slits and tabs in the sensor pattern 18 may be of any design. The design, however, must be incorporated in the microprocessor 54 such that the information sensed by the sensor 52 will correspond to the information in the microprocessor 54. This ensures that proper instructions are transmitted or communicated to the stepper motor 12. In this way, the microprocessor 54, as a result of the information provided by the sensor 52, registers the location of the home position relative to any part of the sensor pattern 18.

The home position of the cartridge holder 10 corresponds to the position at which a cartridge may be loaded or unloaded into and from the internal cavity 16. In the embodiment illustrated, the home position is located at the slit 30 between the tabs 40 and 42 and is illustrated beneath the sensor 52 in FIG. 2. The home position is defined in the sensor pattern 18 by inverting the plurality of the index slits 22–35 and tabs 36–48 on opposite sides of the home position. More specifically, the spacing and number of tabs at positions clockwise from the home position are greater in number and in spacing then the spacing of the slits, whereas the opposite is true in the counterclockwise direction from the home position. Due to this inversion of polarity, by rotating the cartridge holder 10 an amount slightly greater than the width of an index slit or tab, the microprocessor 54 can determine the polarity of the slits/tabs and the direction of displacement of the cartridge holder 10 from the loading or home position. This allows the cartridge holder 10 to be moved to the home position without excessively running the motor 12 up against mechanical stops within the assembly and without prematurely accessing sample or reagents in various sections of an analytical reagent cartridge.

Reconstituting and mixing of reagents within an analytical reaction cartridge is accomplished through rotation of the cartridge holder 10. This is achieved through the use of the stepper motor 12. In a preferred embodiment, the total rotation of the cartridge holder 10 is limited to less than 360°, and all critical read positions are located at an integer number of 1.8° apart which corresponds to a full step. For example, in a preferred embodiment, a reagent pick up position can correspond to a position where the slit 35 is located at the sensor 52, and a capillary pick up position can correspond to the location of the sensor pattern 10 with the tab 46 rotated to the position of the sensor 52.

Figure 2:
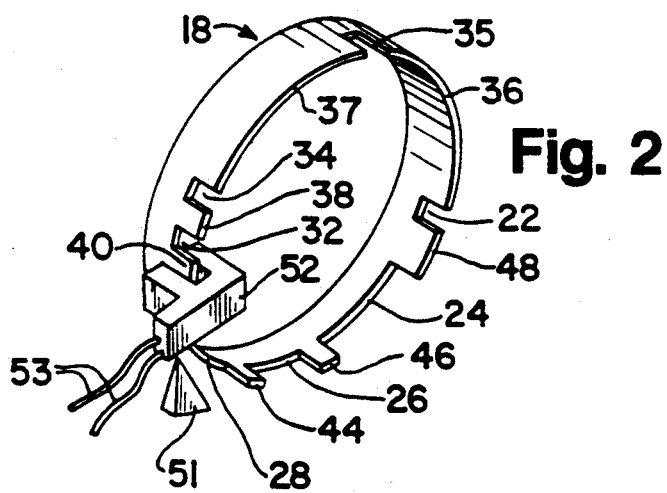
FIG. 2 is a perspective illustration of a sensor pattern and sensor with the sensor pattern in the home position.

In a preferred embodiment, the motor 12 is normally operated in a half step mode. The rotation rate of the motor 12 is programmable and can be optimized for each reagent test type. The maximum rotation rate in a preferred embodiment is twenty steps per second (60 RPM). The cartridge loading position corresponds to the home position of the cartridge holder 12 (FIG. 2). As viewed from the sensor 52, the home/index sensor input index encoding will transition from tabs at the counterclockwise limit of rotation to slits at the clockwise limit of rotation. By rotating the cartridge holder 10 clockwise, the home position can be determined from the first index transition following this encoding transition.

In a preferred embodiment, to home the cartridge holder 10 the shortest route is taken to avoid undesired sample or reagent pickup from within the cartridge. As an example of one procedure that can be followed using the assembly of the present invention, the following procedure can be used to establish the cartridge home position:

1. The Home/Index Sensor is read to determine its current status. If the sensor is blocked (1), the initial motion is counter-clockwise (CCW). If it is clear (0), the motion is clockwise (CW).
2. Half-stepping the motor in the direction determined in step #1 above and reading the Home/Index sensor on each step, motion is continued until ten clear sensor readings or twelve blocked sensor readings are found.
3. If twelve blocked readings are found and motion is in the CCW direction, go to step #6.
4. If twelve blocked readings are found and motion is in the CW direction, change direction to CCW, go to step #6.
5. If ten clear readings are found and motion is in the CCW direction, change direction to CW and go to step #2.
6. The cartridge holder to now rotating in the proper direction to find home.

Half-stepping is continued until three high to low transitions occur. At this point, the home slot has been located.

One example of a slot/tab pattern for the sensor pattern 18 is summarized as follows:

| Step | Angle | Function |
|---|---|---|
| −60.6 | −109.14° | Mechanical Stop |
| −46 | | |
| −44 | −79.2° | End of Test Position |
| −42 | | |
| −27 | | |
| −25 | −45° | Capillary Pick-up Position |
| −23 | | |
| −2 | | |
| 0 | 0° | Cartridge Level |
| 2 | | |
| 8 | 14.4° | Load/Home |
| 10 | | |
| 14 | | |
| 16 | 28.8° | Optical Channels Blocked |
| 18 | | |
| 23 | | |
| 25 | 45° | Sample Read Position |
| 27 | | |
| 73 | | |

-continued

| Step | Angle | Function |
| --- | --- | --- |
| 75 | 135° | Reagent Pick-up Position |
| 77 | | |
| 120 | | |
| 122 | 219.6° | Reagent Pick-up Position |
| 124 | | |
| 127.3 | 229.14° | Mechanical Stop |

The position sensing and motion verification assembly of the present invention requires only a single sensor 52 as compared with prior art assemblies that require multiple sensors. By using a single sensor the expense is minimized, the assembly is more reliable, and the assembly fits in a smaller space. In addition, it is simpler to align a single sensor than to align multiple sensors.

What is claimed is:

1. A position sensing and home position seeking assembly, comprising:
    a rotatable base having a home position;
    a motor driven mechanism for rotating said base clockwise or counterclockwise;
    a sensor pattern of tabs and notches of varying widths on said base, said sensor pattern having a first polarity on a first side of said home position and a second polarity on a second side of said home position;
    a single sensor in relationship to said base in a position to sense said tabs and notches of varying widths; and
    microprocessor means responsive to said sensor for sensing the position of the base and operating said motor driven mechanism to return said base to said home position by the shortest route.

2. The position sensing and home position seeking assembly of claim 1 wherein said base is a holder for an analytical reaction cassette.

3. The position sensing and home position seeking assembly of claim 1 wherein the motor driven mechanism is a stepper motor coupled to said base.

4. The position sensing and home position seeking assembly of claim 1 wherein the sensor pattern includes reflective surfaces.

5. The position sensing and home position seeking assembly of claim 1 wherein the sensor pattern includes a ring mounted on said base having tabs and notches of varying widths formed in said ring.

6. The position sensing and home position seeking assemble of claim 1 wherein the single sensor is an optical interrupter.

7. An assembly for performing sequential analytical reactions, comprising:
    a motor;
    a cartridge holder for an analytical reaction cartridge, said cartridge holder coupled to said motor for rotation clockwise or counterclockwise less than 360 degrees;
    a sensor pattern on said cartridge holder, said sensor pattern having a home position corresponding to a cartridge loading and unloading position, wherein said sensor pattern has a polarity which is inverted on opposite sides of said home position;
    a single sensor for sensing said sensor pattern; and
    microprocessor means responsive to said sensor for operating said motor to return said cartridge holder to said home position by the shortest route after making a preselected series of sequential movement of said assembly.

8. The assembly of claim 7 wherein said motor is a stepper motor.

9. The assembly of claim 7 wherein the sensor pattern includes reflective surfaces.

10. The assembly of claim 7 wherein said sensor pattern includes a ring with slits and tabs of varying widths.

11. The assembly of claim 7 wherein said sensor comprises an optical interrupter.

* * * * *